United States Patent
Hsu et al.

(10) Patent No.: US 11,301,597 B2
(45) Date of Patent: Apr. 12, 2022

(54) SIMULATION APPARATUS AND METHOD

(71) Applicant: Institute For Information Industry, Taipei (TW)

(72) Inventors: Yu-Ling Hsu, Taipei (TW); Kung-Jeng Wang, New Taipei (TW); Wei-Yu Cho, New Taipei (TW); Jing-Ming Chiu, Taipei (TW)

(73) Assignee: INSTITUTE FOR INFORMATION INDUSTRY, Taipei (TW)

( * ) Notice: Subject to any disclaimer, the term of this patent is extended or adjusted under 35 U.S.C. 154(b) by 443 days.

(21) Appl. No.: 16/264,665

(22) Filed: Jan. 31, 2019

(65) Prior Publication Data

US 2020/0159876 A1    May 21, 2020

(30) Foreign Application Priority Data

Nov. 20, 2018 (TW) ................. 107141271

(51) Int. Cl.
*G06F 30/20* (2020.01)

(52) U.S. Cl.
CPC .................... *G06F 30/20* (2020.01)

(58) Field of Classification Search
CPC ...... G06F 30/20; G06F 30/27; G06F 2111/10; G06F 2111/04
USPC .......................................................... 703/7
See application file for complete search history.

(56) References Cited

U.S. PATENT DOCUMENTS

| 9,222,769 B2 * | 12/2015 | Garvey | G05B 19/401 |
| 2017/0286572 A1 * | 10/2017 | Hershey | G05B 23/0283 |
| 2018/0039249 A1 * | 2/2018 | Johnson | G05B 17/02 |
| 2018/0054376 A1 * | 2/2018 | Hershey | H04L 12/66 |
| 2018/0121183 A1 * | 5/2018 | Subramaniyan | G06F 9/45558 |
| 2018/0129959 A1 * | 5/2018 | Gustafson | G06N 5/022 |
| 2018/0137219 A1 * | 5/2018 | Goldfarb | G06N 20/00 |

(Continued)

FOREIGN PATENT DOCUMENTS

| WO | WO-2019180435 A1 * | 9/2019 | G06N 5/04 |
| WO | WO-2019216941 A1 * | 11/2019 | G06K 9/6218 |

OTHER PUBLICATIONS

Banerjee et al. (Generating Digital Twin models using Knowledge Graphs for Industrial Production Lines, 2017, ACM, pp. 1-6) (Year: 2017).*

(Continued)

*Primary Examiner* — Iftekhar A Khan
(74) *Attorney, Agent, or Firm* — CKC & Partners Co., LLC

(57) ABSTRACT

A simulation device and method are provided. The simulation device includes an interface, a storage, and a processor. The storage stores a plurality of digital twin models, each of the digital twin models simulates one entity of the at least one production line. The processor performs the following operations: generating a plurality of task requirements according to a production specification and a production data; broadcasting the task requirements to each of the digital twin models that meets one of the task requirements, wherein each of the digital twin models generates a state report based on the received task requirements; generating a plurality of task twin models based on the state reports, wherein each of the task twin models includes a group of digital twin models corresponding to the task requirements; and generating a plurality of simulation results according to the task twin models.

18 Claims, 4 Drawing Sheets

(56) References Cited

U.S. PATENT DOCUMENTS

| | | | | |
|---|---|---|---|---|
| 2018/0137424 | A1* | 5/2018 | Gabaldon Royval | G06N 5/022 |
| 2018/0174057 | A1* | 6/2018 | Citriniti | G06Q 10/04 |
| 2018/0189332 | A1* | 7/2018 | Asher | G06N 20/00 |
| 2018/0202431 | A1* | 7/2018 | Freund | F04B 25/00 |
| 2018/0231962 | A1* | 8/2018 | Rasheed | G05B 23/0283 |
| 2018/0357343 | A1* | 12/2018 | Klenner | G06F 30/20 |
| 2019/0138333 | A1* | 5/2019 | Deutsch | G06F 30/20 |
| 2019/0138662 | A1* | 5/2019 | Deutsch | G06F 30/00 |
| 2019/0138667 | A1* | 5/2019 | Benesh | G06Q 10/063 |
| 2019/0138970 | A1* | 5/2019 | Deutsch | G06F 9/542 |
| 2019/0243933 | A1* | 8/2019 | Roemerman | G06N 20/20 |
| 2019/0258747 | A1* | 8/2019 | Milev | G06F 16/90335 |
| 2020/0042657 | A1* | 2/2020 | Todd | G06F 30/20 |
| 2020/0074029 | A1* | 3/2020 | Date | G06F 30/23 |
| 2020/0394351 | A1* | 12/2020 | Roemerman | G06F 30/27 |
| 2021/0110075 | A1* | 4/2021 | Dalloro | G06F 30/12 |
| 2021/0157312 | A1* | 5/2021 | Celia | G06K 9/6263 |
| 2021/0287459 | A1* | 9/2021 | Cella | G06F 30/20 |

OTHER PUBLICATIONS

Chhetri et al. (Digital Twin of Manufacturing Systems, 2017, University of California, Irvine, pp. 1-19) (Year: 2017).*

* cited by examiner

SIMULATION APPARATUS AND METHOD

PRIORITY

This application claims priority to Taiwan Patent Application No. 107141271 filed on Nov. 20, 2018, which is hereby incorporated by reference in its entirety

FIELD

The present invention relates to a simulation device and method. Specifically, the present invention relates to a simulation device and method for generating simulation results based on the digital twin models.

BACKGROUND

With the rapid development of technology, the order types and production specification/demands of customers are becoming more and more complex, and manufacturers need to determine accurately whether production resources they own can meet the order production specification/demands of customers and how to schedule the production line. Decision makers for the production line often need to quickly understand the operation of the production line. For the information integration, manufacturers have gradually adopted computer integration systems (e.g., war room system, production monitoring system, etc.) to provide relevant information to the decision makers to schedule the production line, control the production machines, and manage the orders.

However, the conventional war room system or the production monitoring system only focuses on collecting information through the production line, performing a simple analysis and managing the visualization data, and only to schedule the production line according to the all machines/stations in the production line. Accordingly, it is hard to effectively integrate resources from multiple production lines. Therefore, the conventional technology cannot effectively assist the decision makers to make a decision to achieve maximum production benefits.

Accordingly, in the production control process of the manufacturing industry, an urgent need exists in the art that how to efficiently generate simulation results that can assist decision makers to make decisions.

SUMMARY

To solve the aforesaid problem, provided are a simulation device and a method applicable to production control.

A simulation device in one example can comprise an interface, a storage, and a processor, and the processor is electrically connected to the interface and the storage. The interface is configured to access a production specification (SPEC) and a production data related to at least one production line. The storage stores a plurality of digital twin models, each of the digital twin models simulating one entity of the at least one production line. The processor generates a plurality of task requirements according to the production specification and the production data. The processor further broadcasts the task requirements to each of the digital twin models that meets one of the task requirements, wherein each of the digital twin models generates a state report based on the received task requirements. The processor further generates a plurality of task twin models based on the state reports, wherein each of the task twin models includes a group of digital twin models corresponding to the task requirements. The processor further generates a plurality of simulation results according to the task twin models.

A simulation method, which is adapted for a simulation device, is also provided. In one example, the simulation device can accesses a production specification and a production data related to at least one production line, stores a plurality of digital twin models, each of the digital twin models simulating one entity of the at least one production line. The simulation method being performed by the simulation device can comprise the following steps: generating a plurality of task requirements according to the production specification and the production data; broadcasting the task requirements to each of the digital twin models that meets one of the task requirements, wherein each of the digital twin models generates a state report based on the received task requirements; generating a plurality of task twin models based on the state reports, wherein each of the task twin models includes a group of digital twin models corresponding to the task requirements; and generating a plurality of simulation results according to the task twin models.

As can be known from the above descriptions, the simulation technology (at least including a device and a method) provided herein generates a plurality of task requirements according to a production specification proposed by the customer and a production data, and then broadcasts the task requirements to each of the digital twin models that meets one of the task requirements. The simulation technology generates a plurality of task twin models based on the state reports, and then generates a plurality of simulation results according to the task twin models. The simulation technology can simulate an entity (operators and machines) in a production line by a digital twin model. Since the digital twin model actually simulates the entity, the state of the entity can be evaluated more accurately. The simulation technology can generate task twin models by dynamically combining the digital twin models that can complete the task, and generate simulation results that can assist the decision maker to make a decision, so that the decision maker can predict the possible situation more accurately.

The detailed technology and preferred embodiments implemented for the subject invention are described in the following paragraphs accompanying the appended drawings for people skilled in this field to well appreciate the features of the claimed invention.

DETAILED DESCRIPTION

In the following description, a simulation device and method be explained with reference to example embodiments thereof. However, these example embodiments are not intended to limit the present invention to any particular example, embodiment, environment, applications, or implementations described in these example embodiments. Therefore, description of these example embodiments is only for purpose of illustration rather than to limit the present invention.

It shall be appreciated that, in the following embodiments and the attached drawings, elements unrelated to the present invention are omitted from depiction. In addition, dimensions of individual elements and dimensional relationships among individual elements in the attached drawings are provided only for illustration but not to limit the scope of the present invention.

Figure 1A:
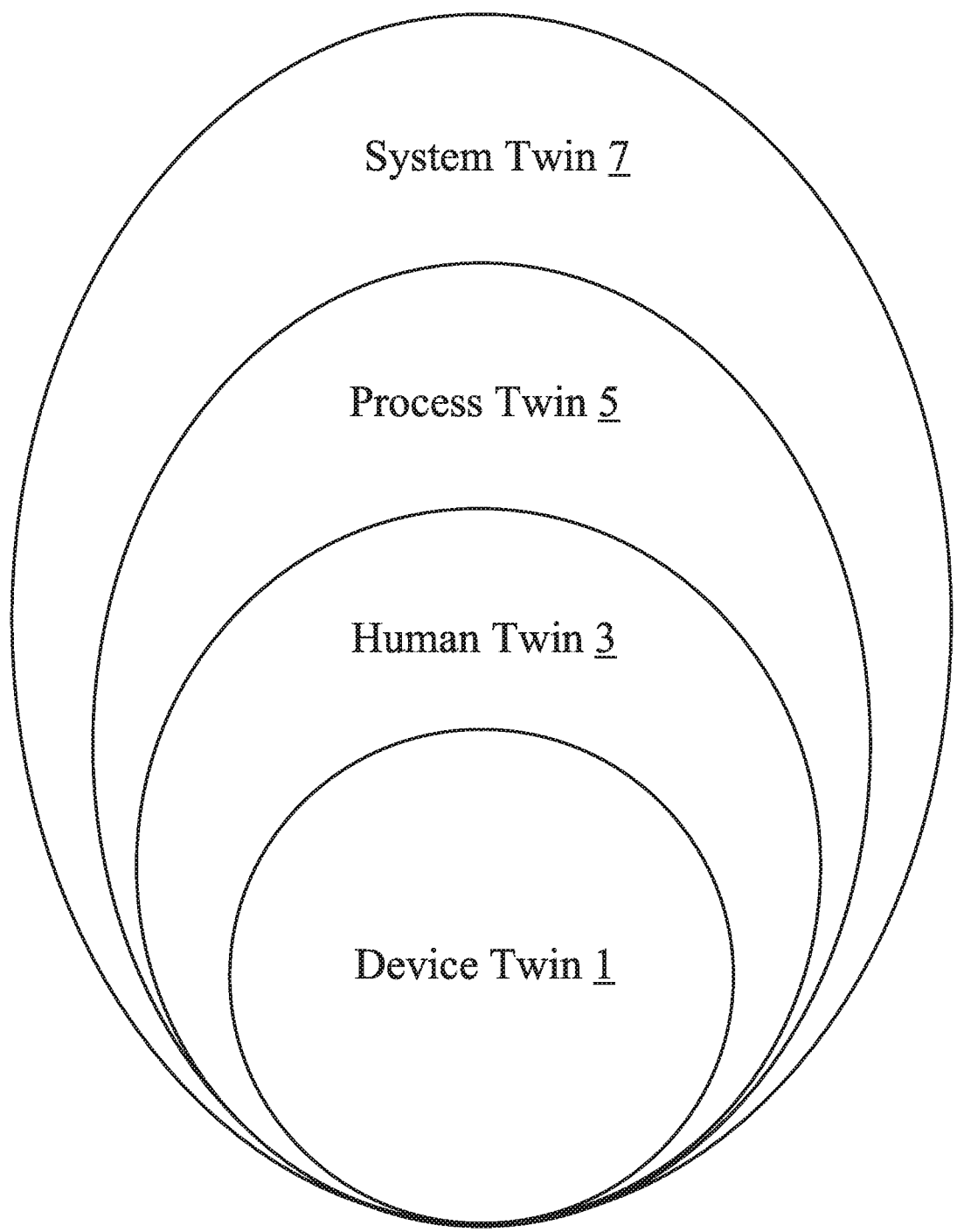
FIG. 1A illustrates a schematic view of the simulation technology provided by the present invention.

The simulation technology provided by the present invention is composed of a plurality of digital twin models (which will be described later), and the schematic diagram thereof is depicted in FIG. 1A. In addition to establishing digital twin models of each equipment and each machine through Device Twin 1 to enhance the understanding and prediction of the on-site hardware condition of the production line, the present invention further establishes digital twin models of each operator (i.e., human) through Human Twin 3 to improve the understanding and prediction of the physical health and mental health (or state) of employees. The digital twin models of the device network (i.e., Device Twin) and the digital twin models of the human network (i.e., Human Twin) can be combined dynamically into Process Twin 5 that considers the interaction between the human and the device to enhance the understanding and prediction of the implementation of the intelligent factory. Finally, for meet the production specification/demands of the customer, System Twin 7 can be established by integrating the digital twin models of the device network, human network, and smart network in the factory to improve the understanding and prediction of the overall states of multiple production lines. The detailed description of the implementation related to the present invention will be described in the following paragraphs. The production line referred in the present invention may include various machines/station and various operators that required for producing a certain product or a certain component. The production line referred in the present invention is not limited to machines or operators configured in the same pipeline (or in the same production line). The production line may include machines that are configured in different places, and the corresponding operators that can be replaced or work in shifts.

Figure 1B:
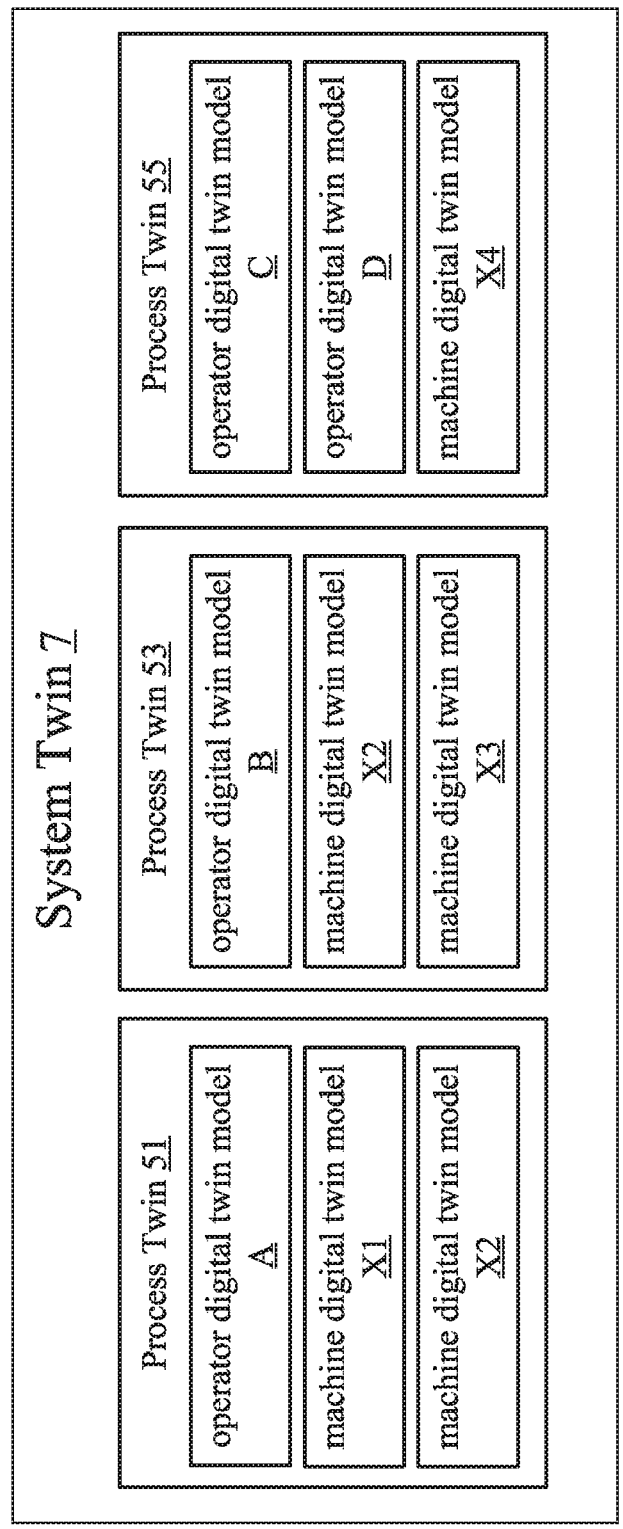
FIG. 1B illustrates a System Twin provided by the present invention.

For example, as shown in FIG. 1B, the System Twin 7 may include a Process Twin 51, a Process Twin 53, and a Process Twin 55. Each of the Process Twin can be composed of a plurality digital twin models of machines and operators configured for producing a certain product. The Process Twin 51 is composed of an operator digital twin model A, a machine digital twin model X1, and a machine digital twin model X2. The Process Twin 53 is composed of an operator digital twin model B, a machine digital twin model X2, and a machine digital twin model X3. The Process Twin 55 is composed of an operator digital twin model C, an operator digital twin model D, and a machine digital twin model X4. The contents of FIG. 1B are provided only for illustration but not to limit the scope of the present invention.

Figure 2:
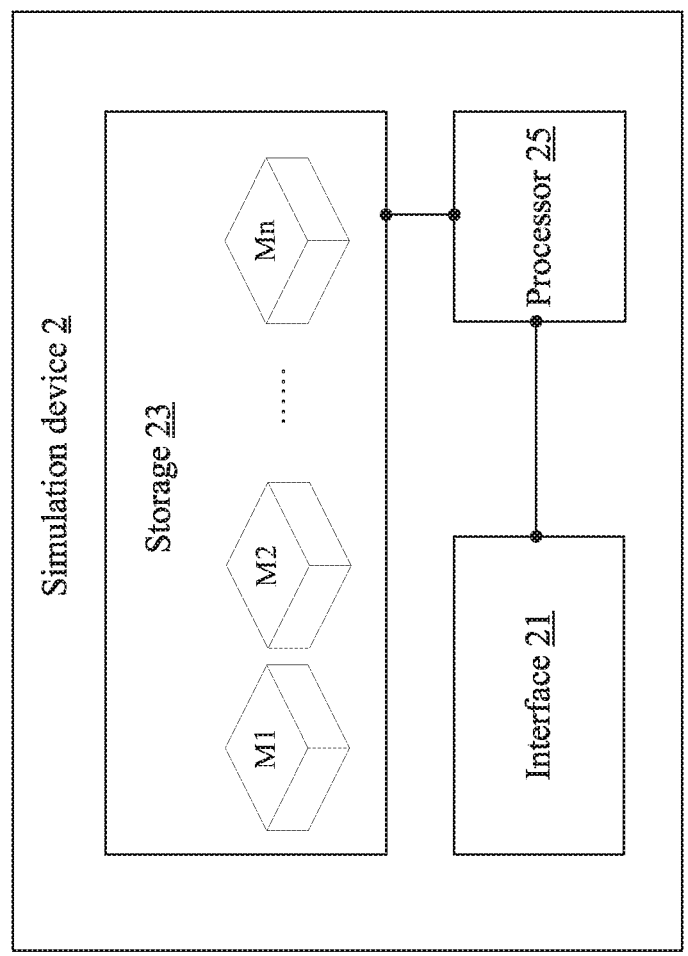
FIG. 2 illustrates a schematic view of the simulation device of the first embodiment.

A first embodiment of the present invention is a simulation device 2 and a schematic view of which is depicted in FIG. 2. The simulation device 2 comprises an interface 21, a storage 23, and a processor 25, wherein the processor 25 is electrically connected to the interface 21 and the storage 23. The interface 21 is an interface for receiving messages (or information), or any other interface known to those of ordinary skill in the art that can perform the same work. The storage 23 may be a memory, a Universal Serial Bus (USB) disk, a hard disk, a Compact Disk (CD), a mobile disk, or any other storage medium or circuit known to those of ordinary skill in the art and having the same functionality. The processor 25 may be any of various processors, Central Processing Units (CPUs), microprocessors, digital signal processors or other computing devices known to those of ordinary skill in the art.

The interface 21 is configured to access a production specification and a production data related to at least one production line, the production specification indicates the content and the deadline of the order required by the customer (e.g., manufacturing 800 industrial computer system products within two days). The production data indicates available resource information related to the at least one production line (e.g., the dates that the machines and operators are idled in each production line). Specifically, the processor 25 collects the states of the current on-site production line, evaluates the states of the current production capacity, and finally determines the available production capacity. For example, the production data evaluated by the processor 25 can indicate the at least one production line has a solder paste printing machine, a reflow oven, a placement machine, an operator with solder paste printing operating skill, the production rate of the solder paste printing machine is 210 pieces/hour, the temperature of the reflow oven is up to 250 degrees Celsius, the maximum allowable deformation of the printed circuit board PCB (Printed Circuit Board) of the placement machine is 0.75%, the work experience of the operator is 8 years, the production rate of the operator is 210 pieces/hour, and the other related resource information.

The storage 23 stores a plurality of digital twin models M1, M2, . . . , Mn, each of the digital twin models simulates one entity of the at least one production line, wherein n is a positive integer. Each of the entities is one of an operator and a machine of the at least one production line. For example, the digital twin model M1 corresponds to a printing machine X1 in a production line, the digital twin model M2 corresponds to a printing machine X2 in another production line, and the digital twin model Mn corresponds to an operator A with printing operating skill. It shall be appreciated that each machine and operator has a corresponding digital twin model. The digital twin model is a digital model that simulates the operation of the entity by collecting the data (e.g., operational data, historical operational data, the component replacement information, etc.) related to the entity, establishes a model that is mapping to the entity through the process of simulation, and reacts the operation cycle and process of the entity by simulating the digital twin model of each entity. Therefore, since the operation simulated by the digital twin model is close to the operation of the entity, the digital twin model can help the decision maker to predict the possible emergency (e.g., yield rate decreasing, machine malfunction, etc.) accurately and make the prediction of the maintenance easier.

It shall be appreciated that the digital twin model is not limited to simulate hardware, equipment, or machine itself. The digital twin model can also simulate the operation of human resources. Specifically, it is possible to generate a digital twin model corresponding to the operator by collecting data related to the operator (e.g., psychological related data, health-related data, efficiency-related data, and the other related data of the operator). In this embodiment, each machine and each operator in each production line is an entity, and each entity corresponds to a digital twin model. It shall be appreciated that the generation method of the digital twin model and the maintenance of the digital twin model are not the focus points of the present invention, and the contents thereof shall be appreciated by those of ordinary skill in the art and thus will not be further described herein.

For example, when one entity simulated by one of the digital twin models is a first operator, the corresponding digital twin model may include at least one of work experience, work skill, a piece of information of production rate, and many pieces of information of the first operator. When one entity simulated by one of the digital twin models is a first machine, the corresponding digital twin model may include at least one of work content, an operation condition, a piece of information of production rate, and many pieces of information of the first machine.

In the present embodiment, the processor 25 generates a plurality of task requirements according to the production specification and the production data, the task requirements indicate the needs of the production capacity to achieve the production specification. For example, after the processor 25 analyzes the production specification, the processor 25 determines that the surface-attachment technology (SMT) is required to achieve the production specification, and the processor 25 generates the task requirements for performing the surface-attachment technology as follows: a qualified machine with the production rate up to 160 pieces/hour, a solder paste printing machine with a paste viscosity of 800 to 1000 kcps, a reflow oven with the temperature of 250 degrees Celsius, a placement machine with 0.75% of maximum allowable deformation of the printed circuit board PCB, and an operator with solder paste printing operating skill, welding processing skill, and more than 5 years of the work experience.

Next, the processor 25 broadcasts the task requirements to the digital twin models that meets one of the task requirements, wherein each of the digital twin models further generates a state report based on the received task requirements. For example, the processor 25 may broadcast each of the task requirements to a digital board to notify all the digital twin models of the machines and the operators that stored in the storage 23 and meet one of the task requirements. Each digital twin model that meets one of the task requirements then generates a state report based on their production schedule (e.g., the time period in which the project has been scheduled to operate, the idle period, and the tasks that may be involved in the future), and transmits the state report back to the processor 25. In some embodiments, each of the state reports includes the information that can help the processor 25 to determine the production schedule. For example, each of the state reports includes at least one of an operation plan, a unit cost, a workload, and a production rate. It shall be appreciated that, in some embodiments, each of the digital twin models may determine whether to participate in the task scheduling by itself, and each of the digital twin models may also register by itself to participate in the task execution. The present invention does not limit the way to receive and the way to participate in task scheduling of each of the digital twin models.

Next, the processor 25 performs production scheduling and delivery evaluation based on the state returns. However, the operators and the machines that meet the task requirements may encounter the situations that the operators and the machines are configured in different production lines, different positions, and different task arrangement at different time points. The processor 25 takes the aforesaid various factor into consideration. Based on the state reports from the digital twin models corresponding to the operator and the machine operating in the same/different production line, the processor 25 takes the completion of the task as a target and dynamically combines the digital twin models into a plurality of task twin models. Specifically, the processor 25 generates a plurality of task twin models based on the state returns, wherein each of the task twin models includes a group of digital twin models corresponding to the task requirements. It shall be appreciated that, the task twin models described here can be regarded as a way to implement the aforementioned Process Twin.

It shall be appreciated that, the task twin model consists of at least one digital twin model, each of the task twin models is a possible combination to fulfill the task requirements. A digital twin model that meets one task requirements (e.g., an operator with solder paste printing operating skill, welding processing skill, and more than 5 years work experience) may participate in different task twin models at the same time. Therefore, by dynamically combining the digital twin models that required to complete the task requirements to generate the task twin model, compared to the separate consideration of the digital twin models, the task twin models (which generated through the dynamic combination) can further take the overall situation that may occur into consideration. In addition, since the digital twin model actually simulates the condition of the entity, according to the simulation results of the digital twin model (digital twin model, task twin model, etc.), the present invention can exclude the situation that some evaluations indicate the entity can be involved in the task but is impossible in the actual operation.

Finally, the processor 25 generates a plurality of simulation result according to the task twin models. Specifically, the processor 25 determines if the production specification is feasible according to the task twin models. If the production specification is feasible, each of the simulation results is a simulated production line schedule, and the simulated production line schedule is at least one production line configuration corresponding to the production specification. Since each of the simulation results provides at least one production line configuration, the simulation results can assist the decision maker to make a decision and improve the accuracy of the decision. If the processor 25 determines that the production specification proposed by the customer is not feasible according to the task twin models. The simulation result may output the corresponding information that cannot fulfill the task requirements (e.g., lack of an operator with certain work skill, the production line time cannot match, etc.). It shall be appreciated that, the production line configuration indicated by the simulated production line schedule is not limited to the same production line, a new production line configuration can be integrated across the resources from different production lines.

In some embodiments, the processor 25 further optimizes the outcomes of the simulation results. Specifically, the processor 25 further receives a target demand which may be proposed by the decision maker, and the target demand includes at least one of a minimal total cost configuration, a maximum demand fulfillment configuration, and a maximum profit configuration. Based on the target demand, the processor 25 calculates a simulation result that best meets the target demand as an operational suggestion from the simulation results (i.e., at least one production line configuration). For example, when the target demand is a minimal total cost configuration, the processor 25 calculates various production line configurations that meet the production specification and selects the lowest total cost line configuration as the operational suggestion.

In some embodiments, the processor 25 can feed back a multi-target production decision behavior that learned from the previous senior decision maker to a deep learning model, and generate an operational suggestion through the deep learning model, or input the production data to a neural network for a target prediction. It shall be appreciated that, the optimization can be implement by a decision matrix, numerical standardization, weighting, determining the optimal solution and the worst solution, distinguishing measures, and the approximate value of the optimal solution, and the contents thereof shall be appreciated by those of ordinary skill in the art and thus will not be further described herein.

In some embodiments, the simulation device 2 further comprises a display (not shown) for displaying the simulation results through visualization. Display the results on the display to assist the decision maker to make a decision.

As can be known from the above descriptions, the simulation device 2 generates a plurality of task requirements according to a production specification proposed by the customer and a production data, and then broadcasts the task requirements to each of the digital twin models that meets one of the task requirements. The simulation device 2 generates a plurality of task twin models based on the state reports, and then generates a plurality of simulation results according to the task twin models. The simulation device 2 simulates an entity (operators and machines) in a production line by a digital twin model. Since the digital twin model actually simulates the entity, the state of the entity can be evaluated more accurately. The simulation device 2 generates task twin models by dynamically combining the digital twin models that can complete the task, and generates simulation results that can assist the decision maker to make a decision, so that the decision maker can predict the possible situation more accurately. In addition, the simulation device 2 generates a corresponding operational suggestion to assist the decision maker to make a decision by calculating the target demand set by the decision maker.

Figure 3:
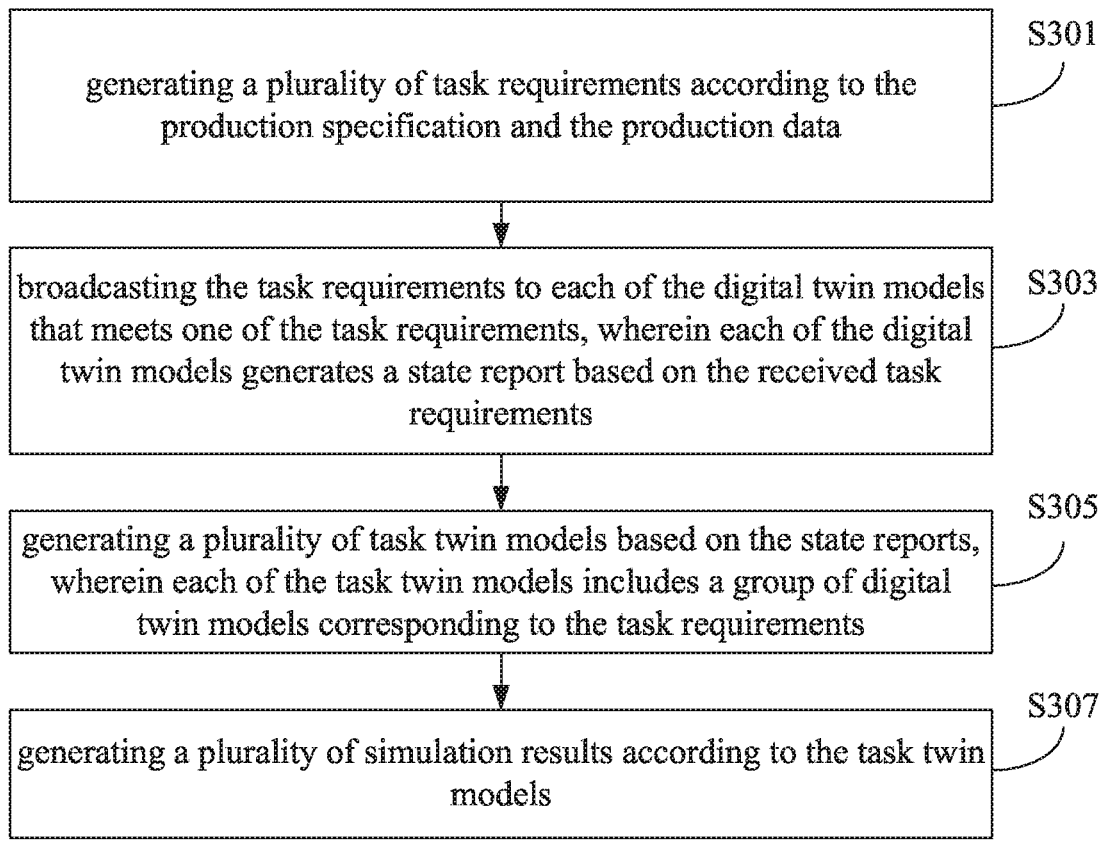
FIG. 3 is a partial flowchart of the simulation method of the second embodiment.

A second embodiment of the present invention is a simulation method and a flowchart of which is depicted in FIG. 3. The simulation method is adapted for a simulation device (e.g., the simulation device 2 of the first embodiment). The simulation device accesses a production specification and a production data related to at least one production line, and stores a plurality of digital twin models, each of the digital twin models simulates one entity of the at least one production line. The simulation method in the present embodiment generates a plurality of simulation results via steps S301 to S307.

In some embodiments, wherein each of the entities is one of an operator and a machine of the at least one production line. In some embodiments, wherein when one entity simulated by one of the digital twin models is a first operator, the corresponding digital twin model includes at least one of work experience, work skill, a piece of information of production rate, and many pieces of information of the first operator. In some embodiments, wherein when one entity simulated by one of the digital twin models is a first machine, the corresponding digital twin model includes at least one of work content, an operation condition, a piece of information of production rate, and many pieces of information of the first machine.

In the step S301, the simulation device generates a plurality of task requirements according to the production specification and the production data, the task requirements indicate the needs of the production capacity to achieve the production specification.

Next, in step S303, the simulation device broadcasts the task requirements to each of the digital twin models that meets one of the task requirements, wherein each of the digital twin models generates a state report based on the received task requirements. In some embodiments, wherein each of the state reports includes at least one of an operation plan, a unit cost, a workload, and a production rate. In some embodiments, each of the digital twin models may determine whether to participate in the task scheduling by itself, and each of the digital twin models may also register by itself to participate in the task execution. The present invention does not limit the way to receive and the way to participate in task scheduling of each of the digital twin models.

Next, in step S305, the simulation device generates a plurality of task twin models based on the state reports, wherein each of the task twin models includes a group of digital twin models corresponding to the task requirements. It shall be appreciated that, the task twin model consists of at least one digital twin model, each of the task twin models is a possible combination to fulfill the task requirements. A digital twin model that meets one task requirements (e.g., an operator with solder paste printing operating skill, welding processing skill, and more than 5 years work experience) may participate in different task twin models at the same time. Therefore, by dynamically combining the digital twin models that required to complete the task requirements to generate the task twin model, compared to the separate consideration of the digital twin models, the task twin models (which generated through the dynamic combination) can further take the overall situation that may occur into consideration.

Thereafter, in step S307, the simulation device generates a plurality of simulation results according to the task twin models. Specifically, the simulation device determines if the production specification is feasible according to the task twin models. If the production specification is feasible, each of the simulation results is a simulated production line schedule, and the simulated production line schedule is at least one production line configuration corresponding to the production specification. Since each of the simulation results provides at least one production line configuration, the simulation results can assist the decision maker to make a decision and improve the accuracy of the decision. If the simulation device determines that the production specification proposed by the customer is not feasible according to the task twin models. The simulation result may output the corresponding information that cannot fulfill the task requirements (e.g., lack of an operator with certain work skill, the production line time cannot match, etc.).

In some embodiments, the simulation method further comprises the following steps: receiving a target demand; and generating an operational suggestion according to the target demand and the simulation results. In some embodiments, the target demand includes at least one of a minimal total cost configuration, a maximum demand fulfillment configuration, and a maximum profit configuration.

In some embodiments, the simulation device further comprises a display, the simulation method comprises the following steps: displaying, by the display, the simulation results through visualization.

In addition to the aforesaid steps, the second embodiment can also execute all the operations and steps of, have the same functions, and deliver the same technical effects as the first embodiment. The ways of how the second embodiment executes these operations and steps, has the same functions, and delivers the same technical effects will be readily appreciated by those of ordinary skill in the art based on the explanation of the first embodiment, and thus will not be further described herein.

It shall be appreciated that, in the specification and the claims of the present invention, some words (including: the operator and the machine) are preceded by a term "first" or "second", and these terms "first" and "second" are only used to distinguish different words from each other.

According to the above descriptions, the simulation technology (at least including an device and a method) provided by the present invention generates a plurality of task requirements according to a production specification proposed by the customer and a production data, and broadcasts the task requirements to each of the digital twin models that meets one of the task requirements. The simulation technology generates a plurality of task twin models based on the state reports, and then generates a plurality of simulation results according to the task twin models. The simulation technology provided by the present invention simulates an entity (operators and machines) in a production line by a digital twin model. Since the digital twin model actually simulates the entity, the state of the entity can be evaluated more accurately. The simulation technology provided by the present invention generates task twin models by dynamically combining the digital twin models that can complete the task, and generates simulation results that can assist the decision maker to make a decision, so that the decision maker can predict the possible situation more accurately.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A simulation device, comprising:
   an interface, being configured to access a production specification and a production data related to at least one production line;
   a storage, storing a plurality of digital twin models, each of the digital twin models simulating one entity of the at least one production line;
   a processor, being electrically connected to the interface and the storage and configured to perform the following operations:
   generating a plurality of task requirements according to the production specification and the production data, wherein the task requirements indicate a plurality of production capacity needs to achieve the production specification;
   broadcasting the task requirements to each of the digital twin models that meets one of the task requirements, wherein each of the digital twin models generates a state report based on the received task requirements, and each of the state reports helps the processor to determine a production schedule corresponding to each of the task requirements;
   generating a plurality of task twin models based on the state reports, wherein each of the task twin models includes a group of digital twin models corresponding to the task requirements; and
   generating a plurality of simulation results according to the task twin models.

2. The simulation device of claim 1, wherein each of the entities is one of an operator and a machine of the at least one production line.

3. The simulation device of claim 2, wherein when one entity simulated by one of the digital twin models is a first operator, the corresponding digital twin model includes at least one of work experience, work skill, and a piece of information of production rate of the first operator.

4. The simulation device of claim 2, wherein when one entity simulated by one of the digital twin models is a first machine, the corresponding digital twin model includes at least one of work content, an operation condition, and a piece of information of production rate of the first machine.

5. The simulation device of claim 1, wherein each of the state reports includes at least one of an operation plan, a unit cost, a workload, and a production rate.

6. The simulation device of claim 1, wherein the processor further receives a target demand, and generates an operational suggestion according to the target demand and the simulation results.

7. The simulation device of claim 6, wherein the target demand includes at least one of a minimal total cost configuration, a maximum demand fulfillment configuration, and a maximum profit configuration.

8. The simulation device of claim 1, further comprising a display for displaying the simulation results through visualization.

9. The simulation device of claim 1, wherein each of the simulation results is a simulated production line schedule, and the simulated production line schedule is at least one production line configuration corresponding to the production specification.

10. A simulation method, being adapted for a simulation device, the simulation device accessing a production specification and a production data related to at least one production line, storing a plurality of digital twin models, each of the digital twin models simulating one entity of the at least one production line, the simulation method being performed by the simulation device and comprising:
    generating a plurality of task requirements according to the production specification and the production data, wherein the task requirements indicate a plurality of production capacity needs to achieve the production specification;
    broadcasting the task requirements to each of the digital twin models that meets one of the task requirements, wherein each of the digital twin models generates a state report based on the received task requirements, and each of the state reports helps the simulation device to determine a production schedule corresponding to each of the task requirements;
    generating a plurality of task twin models based on the state reports, wherein each of the task twin models includes a group of digital twin models corresponding to the task requirements; and
    generating a plurality of simulation results according to the task twin models.

11. The simulation method of claim 10, wherein each of the entities is one of an operator and a machine of the at least one production line.

12. The simulation method of claim 11, wherein when one entity simulated by one of the digital twin models is a first operator, the corresponding digital twin model includes at least one of work experience, work skill, and a piece of information of production rate of the first operator.

13. The simulation method of claim 11, wherein when one entity simulated by one of the digital twin models is a first machine, the corresponding digital twin model includes at least one of work content, an operation condition, and a piece of information of production rate of the first machine.

14. The simulation method of claim 10, wherein each of the state reports includes at least one of an operation plan, a unit cost, a workload, and a production rate.

15. The simulation method of claim 10, further comprising:
receiving a target demand; and
generating an operational suggestion according to the target demand and the simulation results.

16. The simulation method of claim 15, wherein the target demand includes at least one of a minimal total cost configuration, a maximum demand fulfillment configuration, and a maximum profit configuration.

17. The simulation method of claim 10, wherein the simulation device further comprises a display and the simulation method further comprises:
displaying, by the display, the simulation results through visualization.

18. The simulation method of claim 10, wherein each of the simulation results is a simulated production line schedule, and the simulated production line schedule is at least one production line configuration corresponding to the production specification.

\* \* \* \* \*